United States Patent [19]

Kariyazono et al.

[11] Patent Number: 5,723,910
[45] Date of Patent: Mar. 3, 1998

[54] SEMICONDUCTOR DEVICE HAVING A MOS STRUCTURE

[75] Inventors: Hiroshi Kariyazono, Tokyo; Katsu Honna, Kawasaki, both of Japan

[73] Assignee: Kabushiki Kaisha Toshiba, Kawasaki, Japan

[21] Appl. No.: 588,679

[22] Filed: Jan. 19, 1996

Related U.S. Application Data

[62] Division of Ser. No. 258,785, Jun. 13, 1994, Pat. No. 5,525,544.

[30] Foreign Application Priority Data

Jun. 14, 1993 [JP] Japan .................... 5-165960

[51] Int. Cl.⁶ .................... H01L 23/48; H01L 23/52; H01L 29/40
[52] U.S. Cl. .................... 257/776; 257/315; 257/773; 257/758
[58] Field of Search .................... 257/370, 314, 257/315, 775, 776, 777, 773, 758

[56] References Cited

U.S. PATENT DOCUMENTS 5,488,243  1/1996  Tsuruta et al. .................... 257/314

Primary Examiner—Mahshid D. Saadat
Assistant Examiner—S. V. Clark
Attorney, Agent, or Firm—Finnegan, Henderson, Farabow, Garrett & Dunner, L.L.P.

[57] ABSTRACT

A first Al wire is connected to a gate electrode. On the first Al wire, an insulating film is provided. In the insulating film, an opening with a large cross-sectional area is made so as to correspond to the first Al wire. In the periphery of the opening, the insulating film is etched by RIE to make an opening. In the central area, the insulating film is etched by wet etching to make an opening. Inside the opening thus made, a second Al wire is formed. The second Al wire is connected to the first Al wire inside the opening. When the opening is made, the number of electrons trapped in the gate oxide film is small because the area etched by RIE is small. Since RIE etches the first Al wire deeper than wet etching, recesses are made around the first Al wire located inside the opening. The first and second Al wires are connected to each other via the recesses.

9 Claims, 6 Drawing Sheets

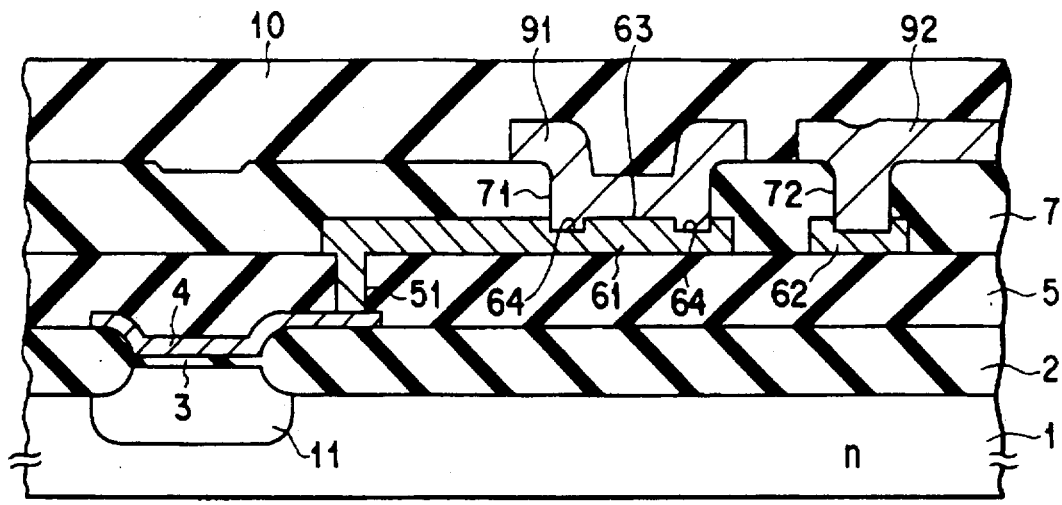
F I G. 1A
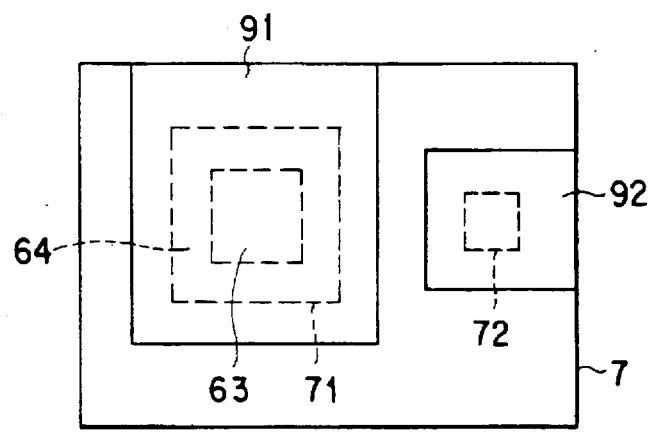
F I G. 1B

SEMICONDUCTOR DEVICE HAVING A MOS STRUCTURE

This is a division of application Ser. No. 08/258,785, filed Jun. 13, 1994, now U.S. Pat. No. 5,525,544.

BACKGROUND OF THE INVENTION

1. Field of the Invention

This invention relates to a semiconductor device with a MOS structure, and more particularly to a structure of connecting wires to each other and a manufacturing method thereof.

2. Description of the Related Art

With the recent remarkable advances in very-large-scale integration technology for semiconductor devices including ICs and LSIs, circuit patterns and connecting wires are getting finer and multilevel structures of interconnections are now more commonplace. Particularly, in MOS transistors, their gate electrodes are connected via an interlayer insulating film to aluminium (Al) wires or refractory metal wires formed in the overlying layer. These wires are further electrically connected via another interlayer insulating film just above them to several wires in still another overlying layer.

FIGS. 8 and 9 show conventional semiconductor devices. In FIG. 8, on the main surface of a silicon semiconductor substrate 1, a field oxide film 2 is formed of, for example, an $SiO_2$ film. In an area of the surface where the field oxide film 2 is not formed, a well area 11 such as a p well is formed. On the well area 11, a gate oxide film 3 is formed of, for example, a thin silicon oxide film. On the gate oxide film 3, the gate electrode 4 of a MOS transistor is formed of, for example, polysilicon. The gate electrode 4 extends over the field oxide film 2. The gate electrode 4 and field oxide film 2 are covered with a first insulating film 5 serving as an interlayer insulating film.

The surface of the first insulating film 5 is flattened. On the flattened surface, patterned aluminium wires of a first layer (hereinafter, referred to as the first Al wires) 61, 62 are formed. The first Al wire 61 is connected to the gate electrode 4 via a contact hole 51 made in the first insulating film 5. The first Al wires 61, 62 are covered with a second insulating film 7. An $SiO_2$ film formed by, for example, plasma CVD techniques is used as the first and second insulating films 5, 7. The second insulating film 7 is flattened, and a photoresist 8 is applied to the flattened film 7. The photoresist 8 is exposed and developed to make an opening in the photoresist 8 to expose the second insulating film 7.

Using the patterned photoresist 8 as a mask, the second insulating film 7 is etched by RIE (Reactive Ion Etching) techniques to make openings 71, 72 in the second insulating film 7 to expose the first Al wires 61, 62. The first Al wire 61 carrying a large current is provided with the opening 71 whose cross-sectional area is large enough for the current, and the second Al wire 62 carrying a small current is provided with the opening 72 whose cross-sectional area is small. Then, the photoresist 8 is removed and the surface of the second insulating film 7 is flattened. On the second insulating film 7 and inside the openings 71, 72, aluminium wires of a second layer (hereinafter, referred to as the second Al wires) 91, 92 are formed as shown in FIG. 9. When etching is effected by the RIE technique, the first Al wires 61, 62 are also somewhat etched by the RIE. Although there is not a large effect because of the slow etching speed, the surface portions corresponding to the openings 71, 72 of the wires are lower than the other surface portions.

As described above, etching is important techniques for manufacturing miniaturized semiconductor devices. Forming a desired pattern in a polycrystal silicon film or an $SiO_2$ film requires high-accuracy etching. In addition to conventional wet etching in solution, plasma etching by means of discharge in gases including halogen and oxygen and dry etching such as RIE have recently been used. In particular, RIE is an important technique in manufacturing high-density semiconductor devices, because the RIE technique enables high-accuracy etching and allows simplification of processes.

To etch an $SiO_2$ film, gases of the fluorocarbon family are used, for example. When the second insulating film 7 is etched by RIE techniques, ions used for etching are charged on the first Al wire 61 corresponding to the large opening 71, causing the potential difference between the top and bottom of the gate oxide film 3. The potential difference causes charges to be trapped in the gate oxide film 3, resulting in fluctuations in the threshold voltage Vth of the MOS transistor. When the potential difference is great, the gate oxide film 3 is destroyed, which will introduce a serious problem to the processing of the semiconductor device and its reliability.

To overcome this problem, it has been a conventional practice to connect a protective element such as a diode to the first Al wire. The protective element prevents charges generated by RIE from being trapped in the gate oxide film. When the effect of charges is great, the protective element must be large accordingly. Thus, the protective element hinders semiconductor devices from being more highly integrated or miniaturized. The phenomenon that charges generated by RIE destroy the gate electrode becomes more noticeable as the semiconductor device is miniaturized more. In particular, when the thickness of the gate oxide film is less than 45 to 50 nm, even a small amount of charges will destroy the gate oxide film. Therefore, the phenomenon is a serious problem.

SUMMARY OF THE INVENTION

The object of the present invention is to provide a semiconductor device capable of preventing the gate oxide film of a MOS transistor from being destroyed by the charge of ions used for RIE even if the insulating film is etched by RIE techniques, and a manufacturing method thereof.

The foregoing object is accomplished by providing a semiconductor device comprising: a semiconductor substrate which has a gate oxide film on its surface, the gate oxide film having a gate electrode thereon; a first metal wire layer provided above the gate electrode and connected to the gate electrode; an insulating film covering the first metal wire layer which has an opening for exposing a portion of the first metal wire layer, at least a portion of the periphery of the first metal wire layer exposed in the opening having a recess; and a second metal wire layer provided inside the opening which is connected to the first metal wire layer.

The foregoing object is also accomplished by providing a method of manufacturing semiconductor devices comprising the steps of: forming a first metal wire layer above a semiconductor substrate, the surface of the semiconductor substrate having a gate oxide film formed thereon, the gate oxide film having a gate electrode thereon, and the first metal wire layer being connected to the gate electrode; covering the first metal wire layer with an insulating film; etching the insulating film corresponding to the first metal wire layer by reactive ion etching to make a second opening in the periphery of an area where a first opening is to be made, the surface of the first metal wire layer being exposed in the second opening, and the insulating film being left in the area enclosed by the second opening; etching the insulating film enclosed by the second opening by wet etching to form the first opening connected to the second opening; and forming a second metal wire layer on the insulating film and inside the first opening to connect the second metal wire layer to the first metal wire layer.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a sectional view of a semiconductor device according to a first embodiment of the present invention;

FIG. 1B is a plan view of a portion of FIG. 1A;

DETAILED DESCRIPTION OF THE PREFERRED EMBODIMENTS

Figure 2A:
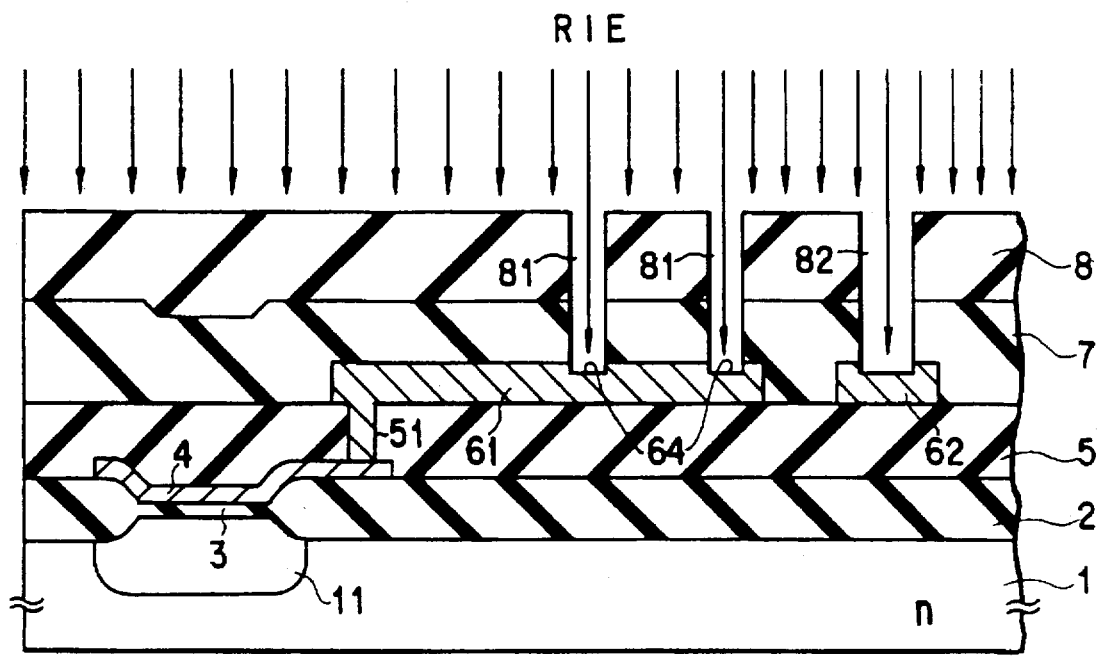
FIG. 2A is a sectional view to help explain the manufacturing processes in the first embodiment.

Hereinafter, referring to the accompanying drawings, embodiments of the present invention will be explained.

FIGS. 1 to 5 show a first embodiment of the present invention. First, referring to FIGS. 1A and 1B, the structure of a semiconductor device associated with the first embodiment will be described.

On the main surface of an n-type silicon semiconductor substrate 1, a field oxide film 2 is formed of, for example, an $SiO_2$ film. In a surface area of the semiconductor substrate 1 where the field oxide film 2 is not formed, a well region 11, such as a p well, is formed. On the well region 11, a gate oxide film 3 is formed of, for example, a thin silicon oxide film. On the gate oxide film 3, a gate electrode 4 of a MOS transistor is formed of, for example, polysilicon. The gate electrode 4 extends over the field oxide film 2. The gate electrode 4 and field oxide film 2 are covered with a first insulating film 5 serving as an interlayer insulating film.

On the surface of the first insulating film 5, patterned aluminium wires of a first layer (hereinafter, referred to as the first Al wires) 61, 62 are formed. The first Al wire 61 is connected to the gate electrode 4 via a contact hole 51 made in the first insulating film 5. The first Al wires 61, 62 are covered with a second insulating film 7.

In the second insulating film 7, openings 71 and 72 for exposing the first Al wires 61, 62 are made. The opening 71 with a large cross-sectional area is made so as to correspond to the first Al wire 61 carrying a large current, whereas the opening 72 with a small cross-sectional area is made so as to correspond to the first Al wire 62 carrying a small current. In the periphery of the first Al wire 62 exposed in the opening 71, a recess 64 is formed so as to be lower than the central portion 63. The surface of the first Al wire 62 exposed in the opening 72 is recessed more than the other portions of this wire. Inside the openings 71, 72 and on the second insulating film 7, aluminium wires of a second layer (hereinafter, the second Al wires) 91, 92 are formed. The second Al wires 91, 92 are connected to the first Al wires 61, 62 respectively inside the openings 71, 72. Because the recess 64 is made in the base of the opening 71, the contact area of the first Al wire 61 and the second Al wire 91 is larger than when the base is flat. The bonding force of the first Al wire 61 and the second Al wire 91 is greater that of the first Al wire 62 and the second Al wire 92. The opening in the second insulating film 7 is not necessarily filled with the second Al wire. For instance, it may be filled with interconnects for connecting wires to each other.

The reason why the base of the opening 71 with the large cross-sectional area has the recess 64 is that it is formed in a different manner from the way the opening 72 is formed. Specifically, the opening 72 is etched only by RIE, whereas the opening 71 is formed using RIE and wet etching. Wet etching hardly etches the Al wires, but RIE etches them slightly. As a result, recesses are made in the surface of the Al wires in the portions etched by RIE.

A method of manufacturing semiconductor devices shown in FIGS. 1A and 1B will be described with reference to FIGS. 2A to 5B.

The present invention is applied to a combination of a CMOS device and a different type of device (e.g., a power element or a bipolar element), such as a Bi-CMOS semiconductor device. In such a semiconductor device, a current flowing through the MOS structure is not very large and consequently wires are narrow. For this reason, when wires formed above and below an interlayer insulating film are connected to each other, it is not necessary to make an opening with a large cross-sectional area in the interlayer insulating film. However, the wires required to carry current to a power element or a bipolar element must have a large width. As an inevitable consequence of this, the cross-sectional area of the opening for connecting those wires to each other will be large.

In manufacturing such semiconductor devices, semiconductor devices are designed, taking into account the width of wires in the MOS structure region and the thickness of gate oxide film, in order not to destroy the gate oxide film even if charges generated by RIE are conveyed to the gate electrode. Even if the opening made in the interlayer insulating film for connecting wires carrying a small amount of current to each other, or the opening 72 with a small cross-sectional area of FIG. 1 is formed all at once, the effect of the charges during the formation can be ignored.

On the other hand, in a case where wires carrying a large amount of current are connected to each other, when the opening 71 with the large cross-sectional area is formed all at once as shown in FIG. 1, as many ions as could destroy the gate oxide film are trapped in the wires. Accordingly, the present invention uses RIE and wet etching to made the opening 71 with the large cross-sectional area in order to reduce the number of ions trapped in the wires. Specifically, in the embodiment, the regions located on the periphery of the opening 71 with the large cross-sectional area is etched by RIE, while the region inside the opening 71 is etched by wet etching.

As shown in FIG. 2A, at the surface region of the n-type silicon semiconductor substrate 1, impurities such as boron are selectively diffused by, for example, ion implantation to form a p-well region 11. Then, for example, by the LOCOS method, a field oxide film (SiO$_2$) 2 is formed which is used as an element isolating region. After this, the semiconductor substrate 1 is heat-treated to form a gate oxide film 3 in a region where no field oxide film 2 is formed. In the embodiment, an opening 81 is of a ring shape, and the thickness of the gate oxide film 3 is approximately 50 nm, for example. On the gate oxide film 3, a gate electrode 4 is formed of, for example, polysilicon. The gate electrode 4 extends over the field oxide film 2. On the gate electrode 4 and field oxide film 2, a first insulating film 5 is formed of, for example, SiO$_2$ by the plasma CVD method. After the surface of the first insulating film 5 is flattened, first Al wires 61, 62 are formed on the first insulating film 5. The first Al wire 61 is connected to the gate electrode 4 via a contact hole 51 made in the first insulating film 5.

Figure 2B:
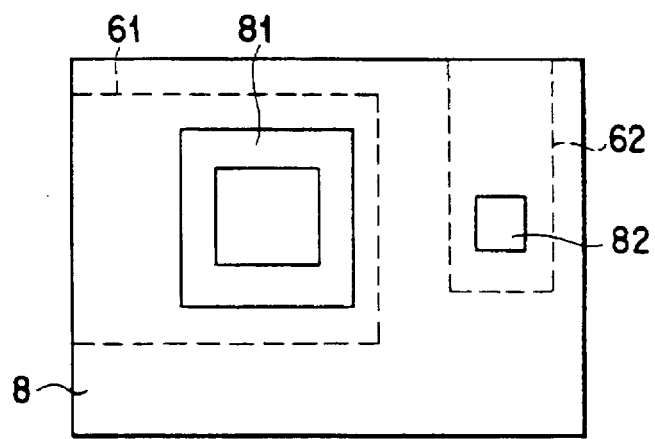
FIG. 2B is a plan view of a portion of FIG. 2A.

Then, the first Al wires 61, 62 are covered with a second insulating film 7. For the second insulating film 7, an SiO$_2$ film formed by, for example, the plasma CVD method is used. After this, the second insulating film 7 is flattened and a photoresist 8 is applied to the flattened film. The photoresist 8 is exposed using a mask (not shown) and then developed to form a desired resist pattern. As a result, in the resist, openings 81, 82 are formed so as to correspond to the first Al wires 61, 62 as shown in FIG. 2B. The opening 82 is made in the second insulating film 7 so as to have a small area one side of which is, for example, 0.5 µm. The pattern of the opening 82 is made so as to have the same shape as that of the opening 72 made in the second insulating film 7. The opening 81 is made in the second insulating film 7 so as to have a large area one side of which is, for example, 1 µm. The pattern of the opening 81 is formed in the second insulating film 7 so as to correspond to the periphery of an area where the opening 71 is to be made.

Figure 3A:
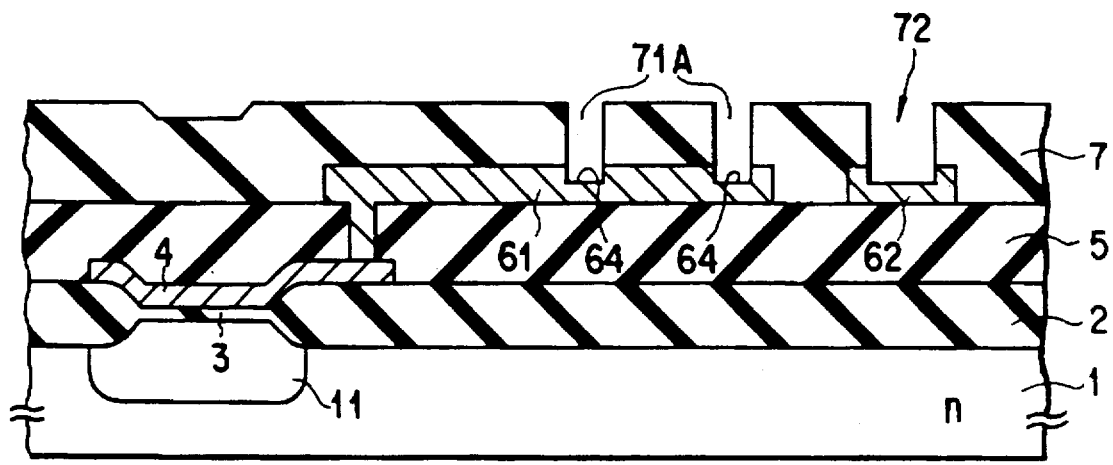
FIG. 3A is a sectional view to help explain a manufacturing process following that in FIG. 2A.
Figure 3B:
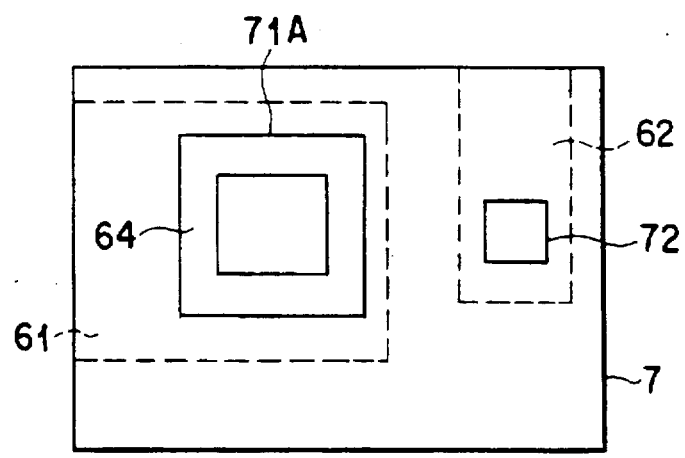
FIG. 3B is a plan view of a portion of FIG. 3A.

Using the photoresist 8 as a mask, the second insulating film 7 is etched by RIE to form an almost square opening 72 and a ringed opening 71A. At the bottom of these openings 71A, 72, the first Al wires 61, 62 are partially exposed. Then, as shown in FIGS. 3A and 3B, the photoresist 8 is removed. In the surface of the second insulating film 7, the opening 72 with a small area is made and also the ringed opening 71A is made so as to correspond to an area where an opening with a large area is to be made. For the RIE, gases of the fluorocarbon family are used, for example. To effect etching by RIE, the surface of the first Al wires 61, 62 is also etched nearly 0.1 µm, and a ringed recess portion 64 is formed in the surface of the first Al wire 61 so as to correspond to the opening 71.

Figure 4A:
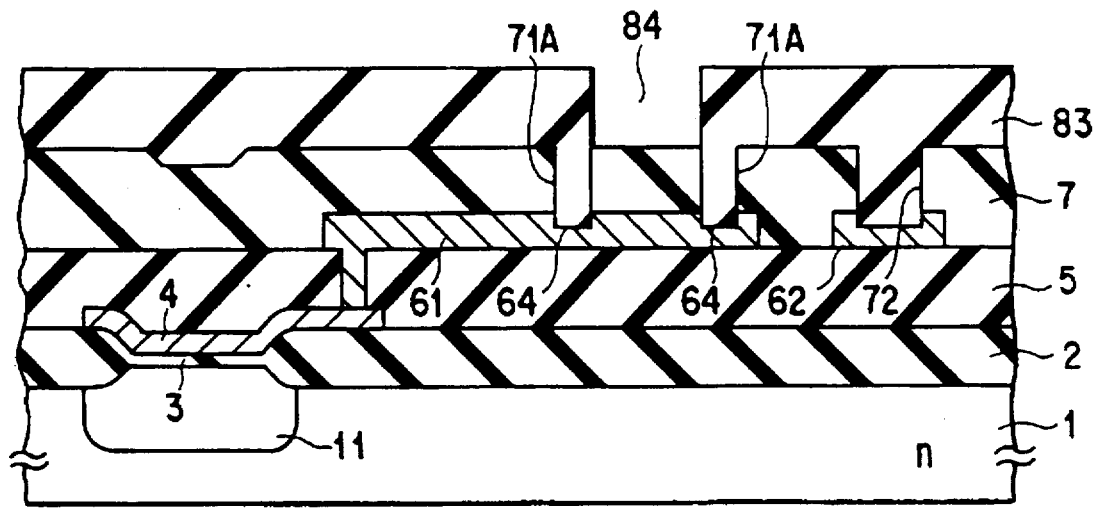
FIG. 4A is a sectional view to help explain a manufacturing process following that in FIG. 3A.
Figure 4B:
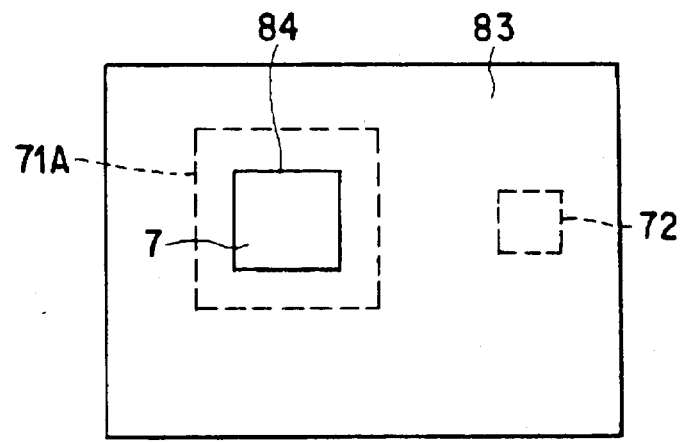
FIG. 4B is a plan view of a portion of FIG. 4A.
Figure 5A:
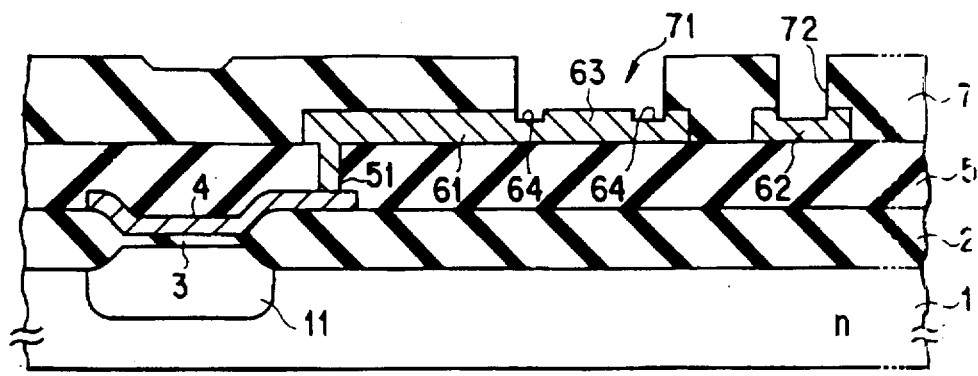
FIG. 5A is a sectional view to help explain a manufacturing process following that in FIG. 4A.
Figure 5B:
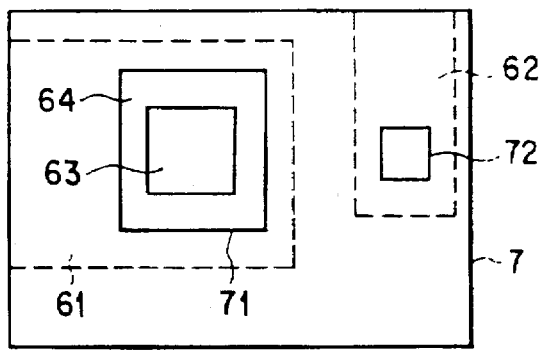
FIG. 5B is a plan view of a portion of FIG. 5A.

Then, a photoresist 83 is formed on the second insulating film 7 as shown in FIGS. 4A and 4B. The photoresist 83 is exposed using a mask (not shown) and then developed to form a desired resist pattern. As shown in FIGS. 4A and 4B, the photoresist 83 covers the ringed openings 71A and opening 72 in the second insulating film 7, and an opening 84 is made in the photoresist 83 corresponding to the central portion of the ringed opening 71A. Using the second photoresist 83 as a mask, the second insulating film 7 inside the opening 84 is subjected to wet etching. For wet etching, a solution of hydrofluoric acid (HF) or 2H$_4$F+NH$_4$H$_2$PO$_4$ is used. After etching is finished, the photoresist 83 is removed as shown in FIGS. 5A and 5B. These two types of etching processes produce the opening 71 with a large area and the opening 72 with a small area. Because the recess 64 lower than the central portion is formed in the periphery of the first Al wire 61 exposed in the opening 71, the surface of the first Al wire 61 is uneven.

After this, as shown in FIG. 1, the second Al wires 91, 92 are formed on the second insulating film 7. These wires 91, 92 are connected to the first Al wires 61, 62, respectively, via the openings 71, 72. Then, for example, by the plasma CVD method, an SiO$_2$ insulating protective film 10 is deposited on the semiconductor substrate containing the second Al wires 91, 92.

With the present embodiment, the area located on the periphery of the opening 71 with a large area is etched by RIE, and the area located inside the opening 71 is etched by wet etching. Thus, because the area of the opening made by RIE is small, the amount of charges on the wires can be reduced, thereby preventing fluctuations in the threshold voltage of the MOS transistor and the breakdown of the gate oxide film.

Furthermore, the periphery of the opening is etched by RIE, and the etched portion is filled with the photoresist 83. Therefore, since overetching will not extend as far as under the photoresist when isotropic etching is effected, an high-accuracy etching can be effected in spite of using wet etching.

The aforementioned etching is isotropic etching. Thus, with this etching method, the lateral direction of the photoresist is also etched, so that it is difficult to make an opening exactly agreeing with the resist pattern. When in the first embodiment, the first opening 71 with a large area is made, the ringed opening 71A is made in the second insulating film by RIE so as to correspond to the periphery of the first opening 71. The photoresist 83 filled in the opening 71A prevents wet etching from taking place in the lateral direction. As a result, the opening with a large area can be formed exactly. The ringed opening 71A filled with the photoresist 83 shown in FIGS. 3A and 3B suppresses the lateral extension of wet etching. Therefore, it is desirable that the opening 71A should be formed on the entire surface of the periphery of the first opening 71 made in the second insulating film 7. However, as long as the opening filled with the photoresist 83 can sufficiently suppress the lateral etching due to wet etching, the opening 81 made in the photoresist 8 may take another shape, not limited to a ring shape.

Figure 6A:
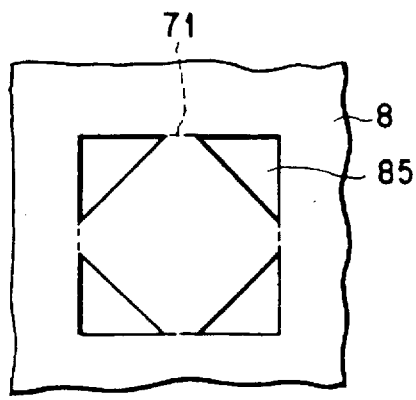
FIGS. 6A and 6B are plan views of other embodiments of the openings made in the photoresist of the present invention.
Figure 6B:
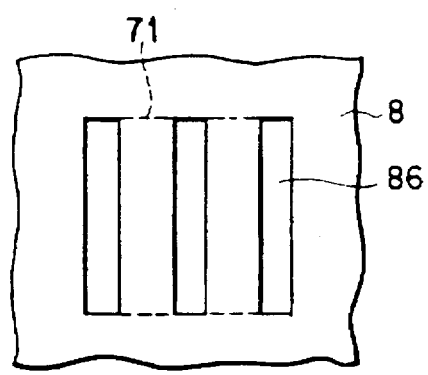

FIGS. 6A and 6B show a second embodiment of the present invention, which is a modification of the opening made in the photoresist 8.

In FIG. 6A, in each corner of an area where the opening 71 is to be made, a triangular opening 85 is made in the photoresist 8. In this embodiment, the adjacent openings 85 are not in contact with each other. Using the photoresist 8 with the opening 85, the second insulating film 7 is etched by RIE to make an opening of the same shape as that of the opening 85 in the second insulating film 7. After this, these openings are filled with a resist (not shown). With these resists as etching stoppers, it is possible to form an opening 71 by removing the second insulating film 7 located inside these resists by wet etching.

On the other hand, in FIG. 6B, a plurality of striped openings 86 are made in the photoresist 8 along an area where the opening 71 is to be made. Although in FIG. 6B, the number of openings 86 is three, as many openings as desired may be made. Two of the openings 86 must be arranged along the area where the opening 71 is to be made. It is not desirable to make longer the distance between the openings 86, because the longer distance permits the sides of the second insulating film 7 between the openings 86 to be etched during wet etching.

Use of the openings 85, 86 shown in FIGS. 6A and 6B can produce the same effect as in the first embodiment. When in the embodiment of FIG. 6A, the tips of the adjacent triangular openings 85 are allowed to be in contact with each other, etching can be effected much more accurately.

As described above, the present invention can prevent RIE-generated charges conveyed to the gate electrode from causing the threshold voltage of the transistor to fluctuate or destroying the gate oxide film. For the size of an opening to which this method can be applied, one side is approximately 0.5 μm long or more when the thickness of the gate oxide film is, for example, nearly 50 nm. Because in the case of an opening one side of which is 0.5 μm or less like the opening 72, the fluctuations and the destruction do not have a particularly large effect, opening may be made only by RIE. When the thickness of the gate oxide film is nearly 25 nm, it is desirable that the method of the present invention should be applied to an opening one side of which is 0.5 μm or less.

Since in the first embodiment, one side of an opening to be subjected to wet etching is approximately 0.8 μm long, the etching ratio of RIE to wet etching for the opening is 9/16. Wet etching can be applied to an opening one side of which is 0.4 μm or more.

Figure 7:
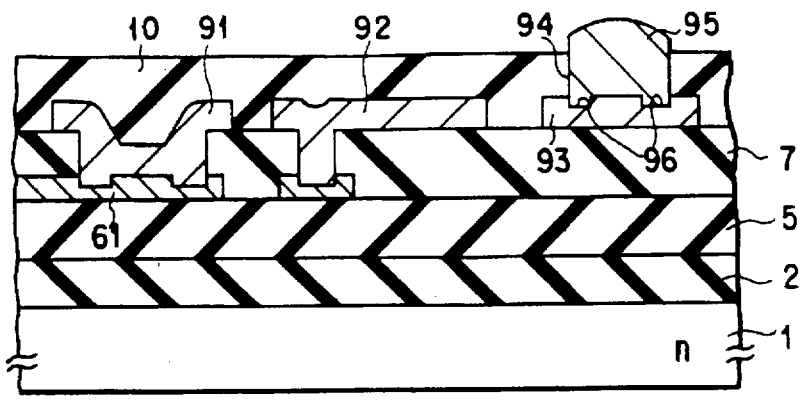
FIG. 7 is a sectional view of a semiconductor device according to a second embodiment of the present invention.
Figure 8:
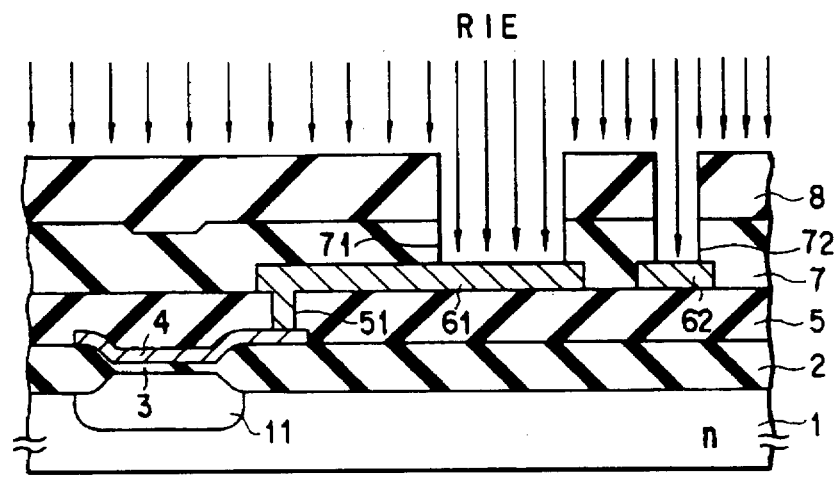
FIG. 8 is a sectional view to help explain a manufacturing process of conventional semiconductor devices.
Figure 9:
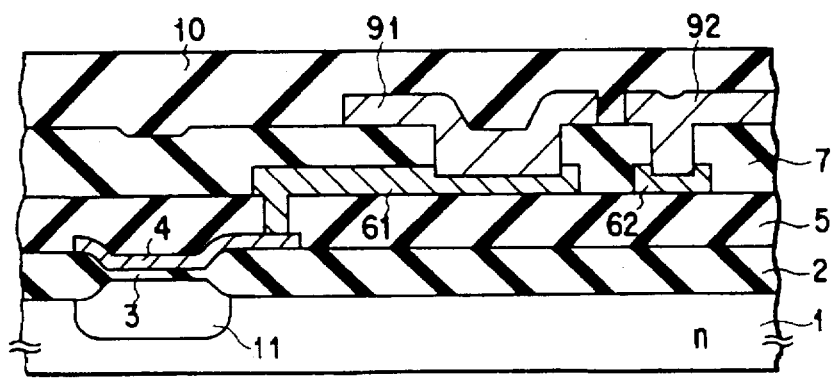
FIG. 9 is a sectional view to help explain a manufacturing process following that in FIG. 8.

FIG. 7 shows a third embodiment of the present invention. In the figure, the same parts as those in FIGS. 1A to 5B are indicated by the same reference characters.

In FIG. 7, on a second insulating layer 7, second Al wires 91, 92, and 93 are formed. These second Al wires 91, 92, and 93 are covered with an insulating layer 10. An opening 94 is made in a place corresponding to the second Al wire 93 in the insulating layer 10. Inside the opening 94, an electrode pad 95 is formed. The electrode pad 95 is connected to the second Al wire 93. When the opening 94 is made in the insulating layer 10, the present invention is applied.

Specifically, in an area of the insulating layer 10 where the opening 94 is to be made, a ringed opening is made by RIE. Next, the insulating layer 10 in the central portion of the ringed opening is removed by wet etching to make the opening 94. In the surface of the second Al wire 93 located on the bottom of the opening 94, a ringed recess portion 96 is formed in the places etched by RIE. Inside the opening 94, an electrode pad 95 to be connected to the second Al wire 93 is formed.

According to the embodiment, when the wires are connected to the electrode pads, the adverse effect of ions used for RIE can be prevented as in the first and second embodiments.

While in the first to third embodiments, transistors and wires are formed on an n-type silicon semiconductor substrate, the conductivity type of a semiconductor substrate is not limited to the n type. The present invention is not limited to silicon semiconductors, but may be applied to any other existing semiconductor material such as Ge or GaAs. This invention may be practiced or embodied in still other ways without departing from the spirit or essential character thereof.

What is claimed is:

1. A semiconductor device comprising:
   a semiconductor substrate having a gate oxide film on a surface thereof, the gate oxide film having a gate electrode thereon;
   a first metal wire layer provided above said gate electrode and connected to said gate electrode;
   an insulating film covering said first metal wire layer and having an opening exposing a surface portion of said first metal wire layer, a portion of the exposed surface portion of said first metal wire layer having a plurality of recesses respectively located therein at corners of the opening; and
   a second metal wire layer provided in the opening and connected to said first metal wire layer.

2. A semiconductor device comprising:
   a semiconductor substrate having a gate oxide film on a surface thereof, the gate oxide film having a gate electrode thereon;
   a first metal wire layer provided above said gate electrode and connected to said gate electrode;
   an insulating film covering said first metal wire layer and having an opening exposing a surface portion of said first metal wire layer, a portion of the exposed surface portion of said first metal wire layer having a ringed recess therein, the ringed recess corresponding to a periphery of the opening; and
   a second metal wire layer provided in the opening and connected to said first metal wire layer.

3. A semiconductor device comprising:
   a semiconductor substrate having a gate oxide film on a surface thereof, the gate oxide film having a gate electrode thereon;
   a first metal wire layer provided above said gate electrode and connected to said gate electrode;
   an insulating film covering said first metal wire layer and having an opening exposing a surface portion of said first metal wire layer, a portion of the exposed surface portion of said first metal wire layer having a recess therein; and
   a second metal wire layer provided in the opening and connected to said first metal wire layer, wherein the recess is in the form of a plurality of striped recesses.

4. A semiconductor device comprising:
   a semiconductor substrate having a gate oxide film on a surface thereof, the gate oxide film having a gate electrode thereon;
   first and second metal wire layers provided above said gate electrode, said first metal wire layer being connected to said gate electrode and being wider than said second metal wire layer;
   an insulating film covering said first and second metal wire layers and having a first opening for exposing a surface portion of said first metal wire layer and a second opening for exposing a surface portion of said second metal wire layer, a portion of the exposed surface portion of said first metal wire layer having a plurality of recesses respectively located at corners of the first opening; and
   third and fourth metal wire layers respectively provided in the first and second openings, said third metal wire layer being connected to said first metal wire layer and said fourth metal wire layer being connected to said second metal layer.

5. A semiconductor device comprising:
   a semiconductor substrate having a gate oxide film on a surface thereof, the gate oxide film having a gate electrode thereon;
   first and second metal wire layers provided above said gate electrode, said first metal wire layer being connected to said gate electrode and being wider than said second metal wire layer;

an insulating film covering said first and second metal wire layers and having a first opening for exposing a surface portion of said first metal wire layer and a second opening for exposing a surface portion of said second metal wire layer, a portion of the exposed surface portion of said first metal wire layer having a ringed recess, the ringed recess corresponding to a periphery of the first opening; and third and fourth metal wire layers respectively provided in the first and second openings, said third metal wire layer being connected to said first metal wire layer and said fourth metal wire layer being connected to said second metal layer.

6. A semiconductor device comprising:

a semiconductor substrate having agate oxide film on a surface thereof, the gate oxide film having a gate electrode thereon;

first and second metal wire layers provided above said gate electrode, said first metal wire layer being connected to said gate electrode and being wider than said second metal wire layer;

an insulating film covering said first and second metal wire layers and having a first opening for exposing a surface portion of said first metal wire layer and a second opening for exposing a surface portion of said second metal wire layer, a portion of the exposed surface portion of said first metal wire layer having a recess; and third and fourth metal wire layers respectively provided in the first and second openings, said third metal wire layer being connected to said first metal wire layer and said fourth metal wire layer being connected to said second metal layer, wherein the recess is in the form of a plurality of striped recesses.

7. A semiconductor device comprising:

a semiconductor substrate having a gate oxide film on a surface thereof, the gate oxide film having a gate electrode thereon;

a first metal wire layer provided above said gate electrode and connected to said gate electrode;

an insulating film covering said first metal wire layer, an opening in said insulating layer exposing a surface portion of said first metal wire layer having a ring-shaped recess therein conforming to a periphery of the opening; and a second metal wire layer provided in the opening and bonded to the exposed surface portion of said first metal wire layer including the ring-shaped recess therein.

8. A semiconductor device comprising:

a semiconductor substrate having a gate oxide film on a surface thereof, the gate oxide film having a gate electrode thereon;

first and second metal wire layers provided above said gate electrode, said first metal wire layer being connected to said gate electrode and being wider than said second metal wire layer;

an insulating film covering said first and second metal wire layers and having a first opening exposing a surface portion of said first metal wire layer and a second opening exposing a surface portion of said second metal wire layer, the exposed surface portion of said first metal wire layer having a ring-shaped recess therein conforming to a periphery of the first opening; and third and fourth metal wire layers respectively provided in the first and second openings, said third metal wire layer bonded to the exposed surface portion of said first metal wire layer including the ring-shaped recess therein and said fourth metal wire layer bonded to the exposed surface portion of said second metal layer.

9. A semiconductor device comprising:

a semiconductor substrate having a gate oxide film on a surface thereof, the gate oxide film having a gate electrode thereon;

a first metal wire layer provided above said gate electrode and connected to said gate electrode;

an insulating film covering said first metal wire layer and having an opening exposing a surface portion of said first metal wire layer, a recess formed in a portion of the exposed surface portion of said first metal wire layer and having side surfaces and a bottom surface of a height different than a surface of the first metal wire layer beyond this opening, said recess being in the form of a plurality of striped recesses or in the form of a plurality of recesses respectively located at corners of the opening; and a second metal wire layer provided in the opening and connected to the exposed surface portion of said first metal wire layer including the recess therein.

* * * * *

UNITED STATES PATENT AND TRADEMARK OFFICE
CERTIFICATE OF CORRECTION

PATENT NO. : 5,723,910
DATED : March 3, 1998
INVENTOR(S) : Kariyazono et al.

It is certified that error appears in the above-indentified patent and that said Letters Patent is hereby corrected as shown below:

Claim 6, column 9, line 18, "agate" should read --a gate--.

Claim 9, column 10, line 41, "this" should read --the--.

Signed and Sealed this

Twenty-ninth Day of June, 1999

Attest:

Q. TODD DICKINSON

*Attesting Officer*    Acting Commissioner of Patents and Trademarks